United States Patent
Abali et al.

(10) Patent No.: US 10,712,788 B2
(45) Date of Patent: Jul. 14, 2020

(54) EXTENDABLE STRUCTURE FOR PROTECTING ELECTRICAL CONNECTORS

(71) Applicant: INTERNATIONAL BUSINESS MACHINES CORPORATION, Armonk, NY (US)

(72) Inventors: Bulent Abali, Tenafly, NJ (US); Paul G. Crumley, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/420,388

(22) Filed: May 23, 2019

(65) Prior Publication Data

US 2019/0278340 A1    Sep. 12, 2019

Related U.S. Application Data

(63) Continuation of application No. 15/802,499, filed on Nov. 3, 2017, now Pat. No. 10,359,814.

(51) Int. Cl.
*H05K 5/00* (2006.01)
*G06F 1/18* (2006.01)
(Continued)

(52) U.S. Cl.
CPC ............ *G06F 1/181* (2013.01); *G06F 1/16* (2013.01); *G06F 1/18* (2013.01); *G06F 1/189* (2013.01);
(Continued)

(58) Field of Classification Search
None
See application file for complete search history.

(56) References Cited

U.S. PATENT DOCUMENTS

| 5,904,592 A | * | 5/1999 | Baran | H02B 1/052 361/627 |
| 6,038,130 A | * | 3/2000 | Boeck | H01R 9/2675 361/735 |

(Continued)

FOREIGN PATENT DOCUMENTS

WO    0251226    6/2002

OTHER PUBLICATIONS

Pending U.S. Appl. No. 15/802,499, filed Nov. 3, 2017, entitled: "Extendable Structure for Protecting Electrical Connectors", pp. 1-26.

(Continued)

*Primary Examiner* — Courtney L Smith
*Assistant Examiner* — Rashen E Morrison
(74) *Attorney, Agent, or Firm* — Tihon Poltavets

(57) ABSTRACT

An apparatus for protecting connectors protruding from a metal enclosure of a hardware canister includes an enclosure that includes one or more components, wherein a portion of the one or more components protrudes out of a first side of the enclosure. The apparatus further includes a first extendable member assembly coupled to a lower interior surface of the enclosure, wherein the first extendable member assembly includes, a first structure coupled to a first compressible member, wherein a force applied to the first structure at the first side of the enclosure translates to the first compressible member and a lower edge of the first structure located below a lower edge of the one or more components, wherein a length of the first structure in an extended state is longer than a length of the protruding portion of the one or more components.

11 Claims, 5 Drawing Sheets

(51) Int. Cl.
  *G06F 1/16* (2006.01)
  *H05K 7/14* (2006.01)
  *H01R 13/639* (2006.01)
  *H02H 9/04* (2006.01)
  *H05K 5/02* (2006.01)

(52) U.S. Cl.
  CPC ............ *H01R 13/639* (2013.01); *H02H 9/04* (2013.01); *H05K 7/1414* (2013.01); *H05K 7/1452* (2013.01); *H01R 2201/06* (2013.01); *H05K 5/0217* (2013.01); *H05K 5/0247* (2013.01)

(56) References Cited

U.S. PATENT DOCUMENTS

| | | | | |
|---|---|---|---|---|
| 6,431,909 B1 * | 8/2002 | Nolden | ................ | H01R 9/2608 361/735 |
| 7,073,971 B2 * | 7/2006 | Schurr | ................... | H02B 1/052 403/325 |
| 7,200,008 B1 | 4/2007 | Bhugra | | |
| 7,234,960 B2 | 6/2007 | Carullo | | |
| 7,382,623 B2 | 6/2008 | Hartman | | |
| 7,869,219 B2 * | 1/2011 | Ma | ....................... | G11C 11/5621 361/737 |
| 8,029,303 B2 * | 10/2011 | Chiang | ................... | H01R 27/00 439/131 |
| 8,149,586 B2 | 4/2012 | Curnalia | | |
| 8,403,376 B2 * | 3/2013 | Greiner | ............... | E05B 47/0012 292/144 |
| 9,137,913 B2 * | 9/2015 | Hsu | ...................... | H05K 5/0221 |
| 9,269,401 B2 | 2/2016 | Randall | | |
| 9,274,548 B2 | 3/2016 | Foisy et al. | | |
| 9,418,036 B2 * | 8/2016 | Xiao | ..................... | G06F 13/409 |
| 2007/0015407 A1 * | 1/2007 | Loftus | ................ | H01R 13/4538 439/607.01 |
| 2007/0235538 A1 * | 10/2007 | Wen | ....................... | G06K 13/08 235/441 |
| 2009/0153002 A1 * | 6/2009 | Kinoshita | ........... | B60R 11/0205 312/223.1 |
| 2010/0233912 A1 * | 9/2010 | Chiang | ................... | H01R 13/60 439/638 |
| 2012/0038177 A1 * | 2/2012 | Greiner | ............... | E05B 47/0012 292/157 |
| 2014/0094050 A1 * | 4/2014 | Yamanaka | ............. | H01R 12/00 439/327 |
| 2016/0050975 A1 * | 2/2016 | Worm | ................... | A24F 47/008 131/328 |
| 2017/0099877 A1 | 4/2017 | Worm | | |
| 2017/0150757 A1 * | 6/2017 | Worm | ................... | A24F 47/008 |

OTHER PUBLICATIONS

IBM, List of IBM Patents or Patent Applications Treated as Related, Appendix P, dated May 28, 2019, 2 pages.
Pending U.S. Appl. No. 15/802,499, filed Nov. 13, 2017, entitled: "Extendable Structure for Protecting Electrical Connections".

* cited by examiner

EXTENDABLE STRUCTURE FOR PROTECTING ELECTRICAL CONNECTORS

FIELD OF THE INVENTION

This disclosure relates generally to protective structures, and in particular, to protective structures for preventing damage to electrical connectors protruding from a hardware enclosure.

BACKGROUND OF THE INVENTION

A computer server rack is an example of an equipment chassis that can utilize multiple hardware canisters, where each hardware canister is removable for quick access to hardware components. The hardware canister can include heavy hardware and electrical components and as a result, the hardware canister can be cumbersome to handle. The hardware canister utilizes electrical connectors for providing power and data to the electrical components, where the electrical connectors plug into a backplane of a rear interior wall of the equipment chassis. The electrical connectors often protrude outside of the metal enclosure of the hardware canister due to the geometry of the backplane of the rear interior wall of the equipment chassis. Due to the heavy weight of the hardware canister, the electrical connectors are susceptible to unintentional damage when maneuvering the hardware canister into and out of the equipment chassis.

SUMMARY

An embodiment of the present invention discloses an apparatus for protecting connectors protruding from a metal enclosure of a hardware canister, the apparatus comprising an enclosure that includes one or more components, wherein a portion of the one or more components protrudes out of a first side of the enclosure; a first extendable member assembly coupled to a lower interior surface of the enclosure, wherein the first extendable member assembly includes: a first structure coupled to a first compressible member, wherein a force applied to the first structure at the first side of the enclosure translates to the first compressible member; and a lower edge of the first structure located below a lower edge of the one or more components, wherein a length of the first structure in an extended state is longer than a length of the protruding portion of the one or more components.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1:
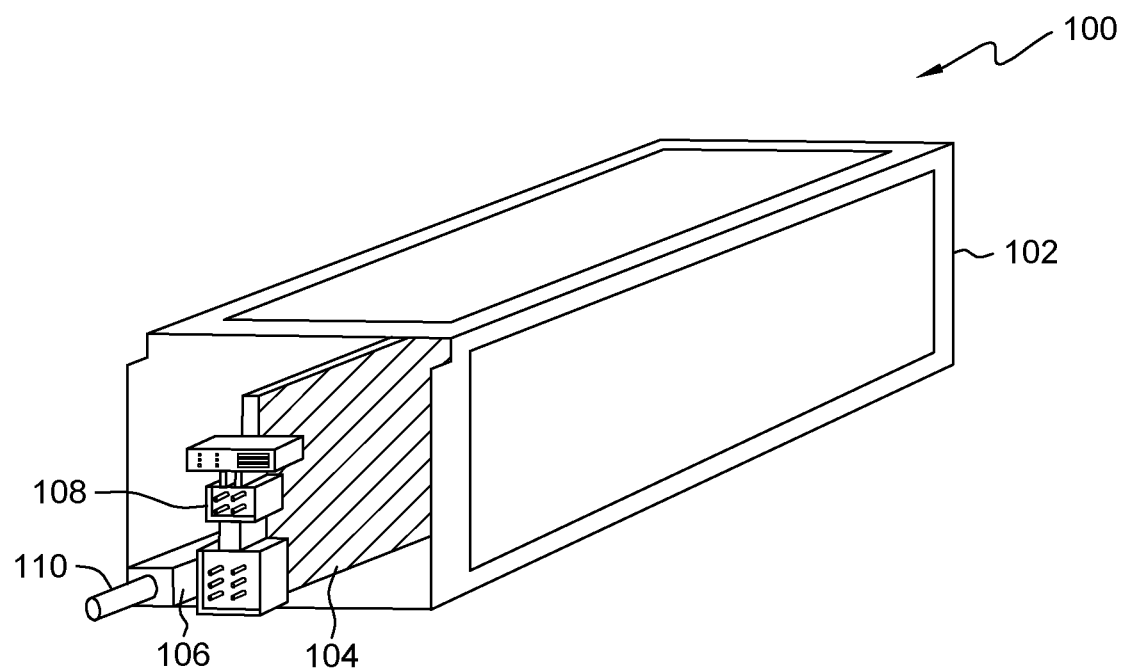
FIG. 1 depicts an extendable piston assembly for a metal enclosure with protruding electrical connectors, in accordance with an embodiment of the present invention.

Embodiments of the present invention provide an extendable structure for protecting electrical connectors protruding from a metal enclosure of a hardware canister. As the hardware canister is removed from an equipment chassis, the weight of the hardware canister combined with gravity can cause the hardware canister to momentarily drop unintentionally. During the momentary unintentional drop, the protruding electrical connectors of the hardware canister might not have cleared a lower surface of the equipment chassis. As a result, the protruding electrical connectors can come into contact with the lower surface of the equipment chassis. The weight of the hardware canister, in addition to the impact with the lower surface due to momentum generated during that momentary drop of the hardware canister, can cause damage to the protruding electrical connectors. The damage to the protruding electrical connectors can include separation of the connector from a circuit board, fracturing, chipping, and misalignment with respect to a backplane of a rear interior wall of the equipment chassis.

An embodiment of the extendable structure for protecting protruding electrical connectors includes an extendable piston assembly for a hardware canister, where a piston can extend and retract to protect the protruding electrical connectors. The piston of the extendable piston assembly can contract as a front surface of the piston is pressed against the backplane of the rear interior wall of the equipment chassis. The piston of the extendable piston assembly can expand due to a spring mechanism as the front surface of the piston is no longer pressed against the backplane of the rear interior wall of the equipment chassis. As the hardware canister is removed out of an equipment chassis, the extended piston acts as a shield and guide for removing the hardware canister without the protruding electrical connectors contacting the lower surface of the equipment chassis. To ensure the protruding electrical connectors do not contact the lower surface of the equipment chassis, the piston extends beyond the protruding electrical connectors and a lower edge of the piston is lower than a lower edge of the protruding electrical connectors.

Another embodiment of the extendable structure for protecting protruding electrical connectors includes an extendable spring loaded arm assembly for a hardware canister, where an arm can extend and retract to protect the protruding electrical connectors. The arm of the extendable spring loaded arm assembly can contract as a front surface of the arm is pressed against the backplane of the rear interior wall of the equipment chassis. The arm of the extendable spring loaded arm assembly can rotate around a pin due to a torsion spring mechanism, as the front surface of the arm is no longer pressed against the backplane of the rear interior wall of the equipment chassis. As the hardware canister is removed out of an equipment chassis, the extended arm acts as a shield and guide for removing the hardware canister without the protruding electrical connectors contacting the lower surface of the equipment chassis. To ensure the protruding electrical connectors do not contact the lower surface of the equipment chassis, the arm extends beyond the protruding electrical connectors and a lower edge of the arm is lower than a lower edge of the protruding electrical connectors.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

FIG. 1 depicts an extendable piston assembly for a metal enclosure with protruding electrical connectors, in accordance with an embodiment of the present invention. In this embodiment, canister 100 includes metal enclosure 102, circuit assembly 104, and extendable piston assembly 106, where circuit assembly 104 includes electrical connectors 108 protruding outside the surrounding walls of metal enclosure 102. Canister 100 can house various computer components which can connect to a chassis (not illustrated in FIG. 1) via electric connectors 108. Extendable piston assembly 106 includes an extendable member 110 (i.e., structure) and a compressible member (e.g., spring), where member 110 has the ability to extend and retract into extendable piston assembly 106. The compressible member of extendable piston assembly 110 bias (i.e., base position) is in an extended state. Member 110 can retract into extendable piston assembly 106, where a front edge of member 110 aligns with a bottom edge of metal enclosure 102. Member 110 can also extend out of extendable piston assembly 106, where a front edge of member 110 in an extended state is beyond a bottom edge of electrical connectors 108.

Figure 2:
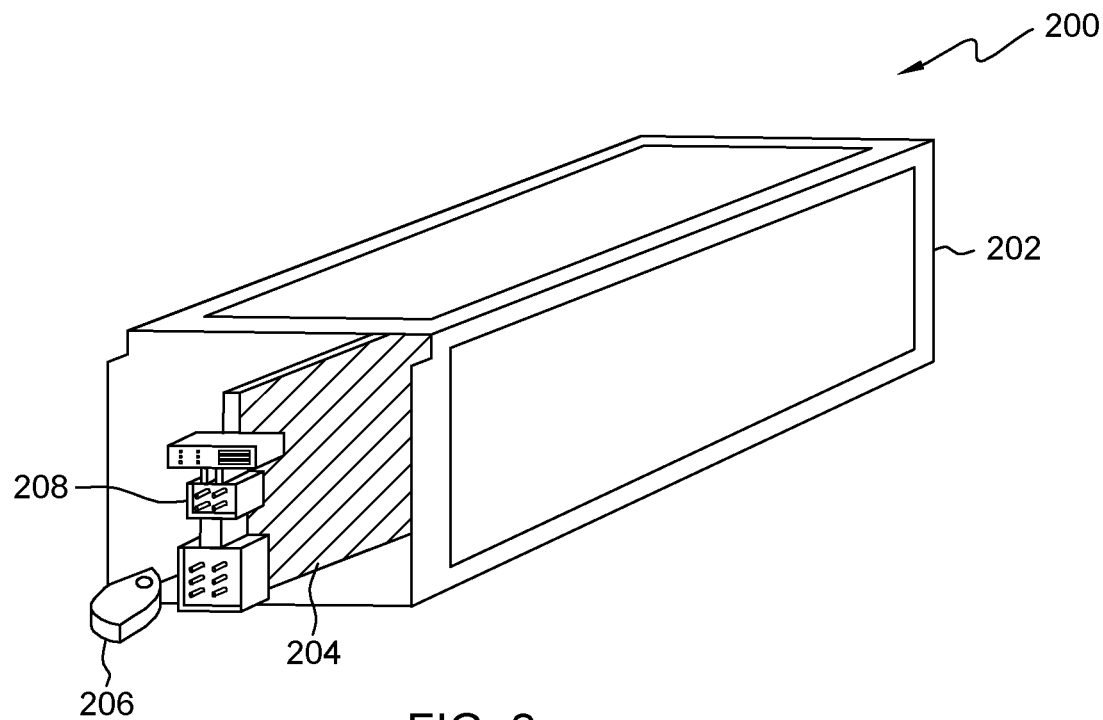
FIG. 2 depicts an extendable spring loaded arm assembly for a metal enclosure with protruding electrical connectors, in accordance with an embodiment of the present invention.

FIG. 2 depicts an extendable spring loaded arm assembly for a metal enclosure with protruding electrical connectors, in accordance with an embodiment of the present invention.

In this embodiment, canister 200 includes metal enclosure 202, circuit assembly 204, and extendable spring loaded arm assembly 206, where circuit assembly 204 includes electrical connectors 208 protruding outside the surrounding walls of metal enclosure 202. Canister 200 can house various computer components which can connect to a chassis (not illustrated in FIG. 2) via electric connectors 208. Extendable spring loaded arm assembly 206 has the ability to extend and retract into metal enclosure 202 by rotating around a center axis of a torsion spring-loaded pin (i.e., compressible member). The torsion spring-loaded pin bias (i.e., base position) is in an extended state, where extendable spring loaded arm assembly 206 is extended out of metal enclosure 202. In a retracted state, a front edge of extendable spring loaded arm assembly 206 aligns with a bottom edge of metal enclosure 202. In an extended state, a front edge of extendable spring loaded arm assembly 206 is beyond a bottom edge of electrical connectors 208.

Figure 3:
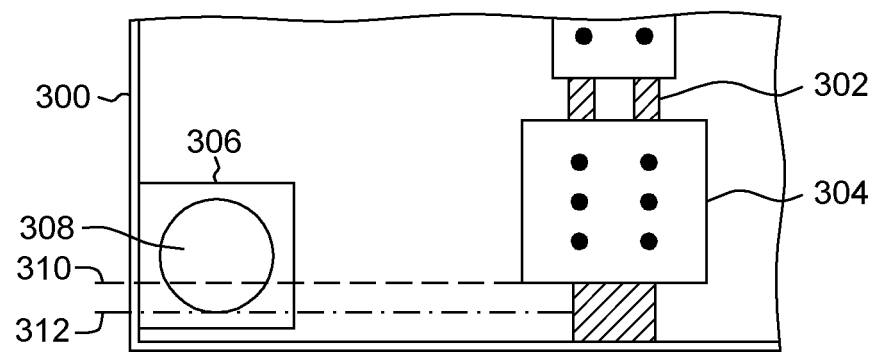
FIG. 3 depicts an enhanced front view of an extendable piston assembly in relation to the protruding electrical connectors, in accordance with one embodiment of the present invention.

FIG. 3 depicts an enhanced front view of an extendable piston assembly in relation to the protruding electrical connectors, in accordance with one embodiment of the present invention.

In this embodiment, metal enclosure 300 includes a vertically mounted circuit assembly 302 with electrical connector 304. Extendable piston assembly 306 is coupled to metal enclosure 300 along two interior surface, an interior surface of a side wall and an interior surface of a bottom wall of metal enclosure 300. Piston 308 of extendable piston assembly 306 is circular in shape, but in other embodiments piston 308 can be any shape. Bottom edge 312 of piston 306 is positioned lower than bottom edge 310 of electrical connector 304, to allow for bottom edge 312 of piston 306 to contact a lower surface of a chassis housing the canister rather than bottom edge 310 of electrical connector 304. The vertical height difference between bottom edge 310 and bottom edge 312 represents a maximum amount of deflection an end of piston 308 can experience when in contact with the lower surface of the chassis housing. The maximum amount of deflection represents that maximum amount of vertical movement an end of piston 308 can deflect while still protecting bottom edge 310 of electrical connector 304.

Figure 4:
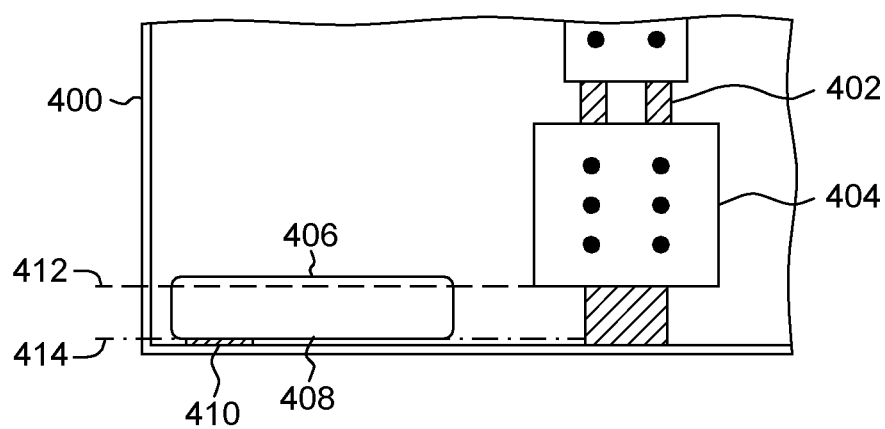
FIG. 4 depicts an enhanced front view of an extendable spring loaded arm assembly in relation to the protruding electrical connectors, in accordance with one embodiment of the present invention.

FIG. 4 depicts an enhanced front view of an extendable spring loaded arm assembly in relation to the protruding electrical connectors, in accordance with one embodiment of the present invention.

In this embodiment, metal enclosure 400 includes a vertically mounted circuit assembly 402 with electrical connector 404. Extendable spring loaded arm assembly 406 is coupled to metal enclosure 400 along an interior surface of a bottom wall of metal enclosure 400. Extendable spring loaded arm assembly 406 includes arm 408 (i.e., structure) and pin 410, where arm 408 rotates about pin 410 in a circular manner. Bottom edge 414 of arm 408 is positioned lower than bottom edge 412 of electrical connector 404, to allow for bottom edge 414 of arm 408 to contact a lower surface of a chassis housing the canister rather than bottom edge 414 of electrical connector 404. The vertical height difference between bottom edge 412 and bottom edge 414 represents a maximum amount of deflection an end of arm 408 can experience when in contact with the lower surface of the chassis housing. The maximum amount of deflection represents that maximum amount of vertical movement an end of arm 408 can deflect while still protecting bottom edge 412 of electrical connector 404.

Figure 5A:
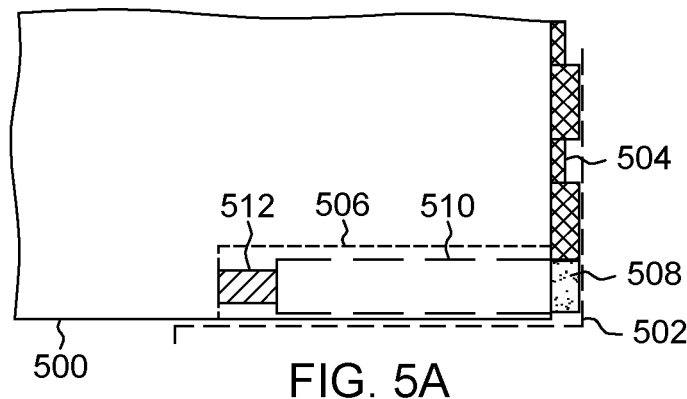
FIG. 5A depicts an enhanced side view of an extendable piston assembly in a retracted state against a rear wall of a chassis, in accordance with one embodiment of the present invention.

FIG. 5A depicts an enhanced side view of an extendable piston assembly in a retracted state against a rear wall of a chassis, in accordance with one embodiment of the present invention.

In this example, canister 500 is situated inside chassis 502, where electrical connectors 504 connect to corresponding connectors on a rear wall of chassis 502. An enhanced cutaway side view of extendable piston assembly 506 illustrates piston 510 being compressed by the rear wall of chassis 502, where piston 510 is in a contracted state inside extendable piston assembly 506. Section 508 represents a portion of piston 510 that remains beyond extendable piston assembly 506, when in the contracted state. In this embodiment, compressible member 512 is a spring capable of compressing and rebounding depending on an amount piston 510 is compressed or extended. In another embodiment, compressible member 512 is a damper capable of compressing to a contracted state and rebounding to an original state.

Maximum compression of compressible member 512 (i.e., spring or damper) occurs when canister 500 is situated inside chassis 502. While compressible member 512 is in maximum compression, compressible member 512 prevents piston 510 from completely entering extendable piston assembly 510. Additionally, extendable piston assembly 510 can include a bump stop with the compressible member, preventing vents piston 510 from completely entering extendable piston assembly 510. In one embodiment, the interior walls of extendable piston assembly 506 can include a ceramic coating to allow for piston 510 to transition between the contracted state and the extended state. In other embodiment, the interior walls of extendable piston assembly 506 can include bearing based rollers to guide piston 510 during transitions between the contracted state and the extended state.

Figure 5B:
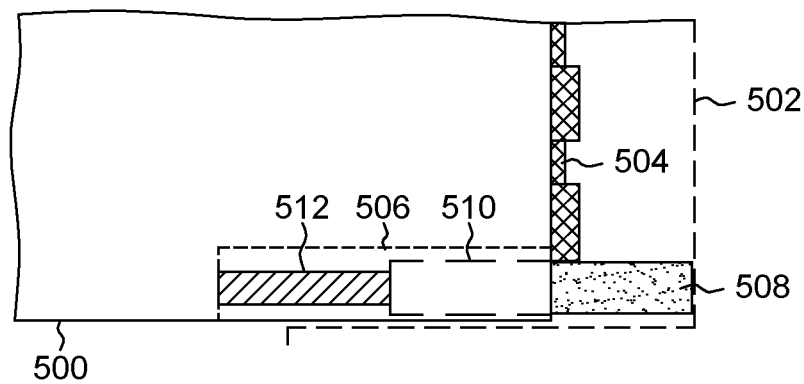
FIG. 5B depicts an enhanced side view of an extendable piston assembly in an extended state during a partial extraction of a metal enclosure from a chassis, in accordance with one embodiment of the present invention.

FIG. 5B depicts an enhanced side view of an extendable piston assembly in an extended state during a partial extraction of a metal enclosure from a chassis, in accordance with one embodiment of the present invention.

In this example, canister 500 is partially situated inside chassis 502, where electrical connectors 504 are no longer connected to corresponding connectors on a rear wall of chassis 502. An enhanced cutaway side view of extendable piston assembly 506 illustrates piston 510 in an extended state, while partially inside extendable piston assembly 506. Section 508 represents a portion of piston 510 that remains beyond extendable piston assembly 506, when in the extended state. As canister 500 is extracted out of chassis 502, compressible member 512 begins to expand at the same rate at which canister 500 is being extracted. As compressible member 512 expands, piston 510 is pushed outside of extendable piston assembly 506. Section 508 of piston 510 begins to increase until piston 510 is in a maximum extended position. Piston 510 can include a protruding stop, where the protruding stop of piston 510 interconnects with a protruding stop on an interior wall of extendable piston assembly 506. The interconnection of the two protruding stops, prevents piston 510 from extending outside extendable piston assembly 506.

Figure 5C:
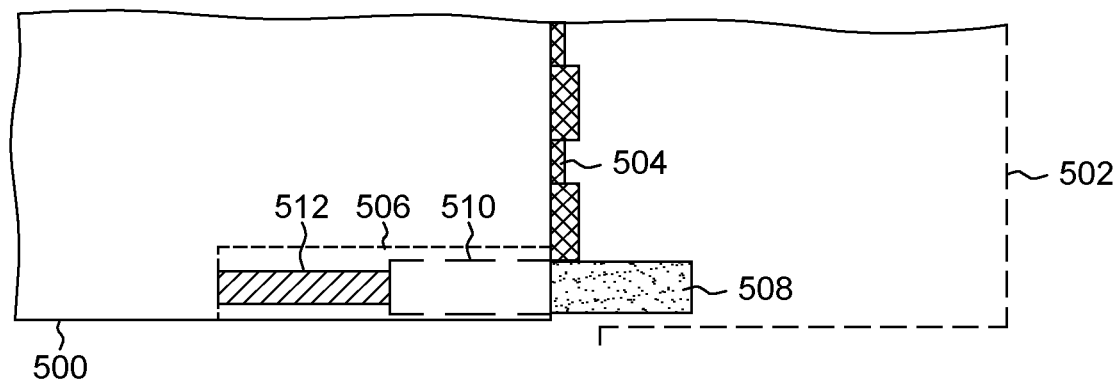
FIG. 5C depicts an enhanced side view of an extendable piston assembly in an extended state during a full extraction of a metal enclosure from a chassis, in accordance with one embodiment of the present invention.

FIG. 5C depicts an enhanced side view of an extendable piston assembly in an extended state during a full extraction of a metal enclosure from a chassis, in accordance with one embodiment of the present invention.

In this example, canister 500 is situated outside chassis 502, where electrical connectors 504 are located past a lower wall of chassis 502. An enhanced cutaway side view of extendable piston assembly 506 illustrates piston 510 in an extended state, while partially inside extendable piston assembly 506. Section 508 represents a portion of piston 510 that remains beyond extendable piston assembly 506, when in the extended state. As canister 500 is full extracted out of chassis 502, section 508 of piston 510 provides a guide and protective barrier against the lower wall of chassis 502. Section 508 of piston 510 protects electrical connectors 504 by preventing electrical connectors 504 from contacting the lower wall of chassis 502. Additionally, a lower edge of section 508 of piston 510 is situated lower than a lower edge of electrical connectors 504, as previously discussed in FIG. 3.

Figure 6A:
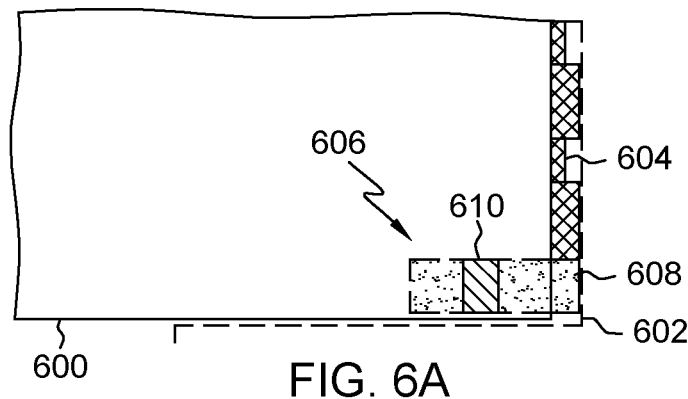
FIG. 6A depicts an enhanced side view of an extendable spring loaded arm assembly in a retracted state against a rear wall of a chassis, in accordance with one embodiment of the present invention.

FIG. 6A depicts an enhanced side view of an extendable spring loaded arm assembly in a retracted state against a rear wall of a chassis, in accordance with one embodiment of the present invention.

In this example, canister 600 is situated inside chassis 602, where electrical connectors 604 connect to corresponding connectors on a rear wall of chassis 602. An enhanced cutaway side view of extendable spring loaded arm assembly 606 illustrates arm 608 being retracted by the rear wall of chassis 602, where arm 608 is in a contracted state. Arm 608 of extendable spring loaded arm assembly 606 pivots around pin 610, where pin 610 utilizes a torsion spring to allow for arm 608 to compress and retract out of canister 600. Maximum compression of the torsion spring utilized by pin 610 occurs when canister 600 is situated inside chassis 602.

Figure 6B:
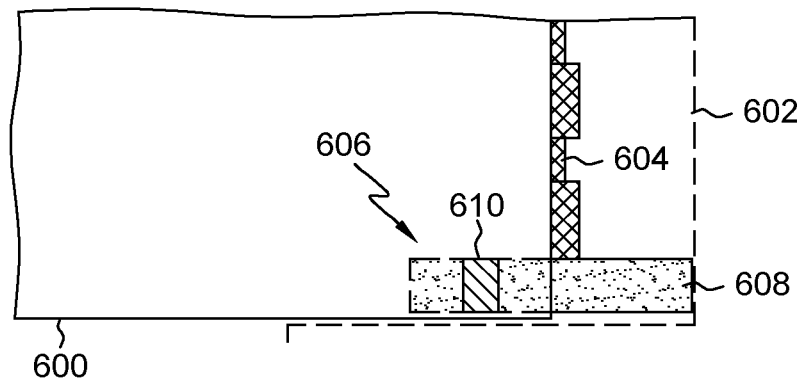
FIG. 6B depicts an enhanced side view of an extendable spring loaded arm assembly in an extended state during a partial extraction of a metal enclosure from a chassis, in accordance with one embodiment of the present invention.

FIG. 6B depicts an enhanced side view of an extendable spring loaded arm assembly in an extended state during a partial extraction of a metal enclosure from a chassis, in accordance with one embodiment of the present invention.

In this example, canister 600 is partially situated inside chassis 602, where electrical connectors 604 are no longer connected to corresponding connectors on a rear wall of chassis 602. An enhanced cutaway side view of extendable spring loaded arm assembly 606 illustrates arm 608 in an extended state. As canister 600 is extracted out of chassis 602, a torsion spring of pin 610 begins to contract as canister 600 is being extracted, due to the releasing of the pressure from the rear wall of chassis 602. As the torsion spring utilized by pin 610 begins to contract, arm 608 is pushed outside of canister 600. Arm 608 can include a protruding stop, where the protruding stop of arm 608 comes into contact with a lower wall of canister 600 preventing further rotation of arm 608 around pin 610. Alternatively, arm 608 of extendable spring loaded arm assembly 606 can extended until the torsion spring of pin 610 reaches a resting state, where the resting state represents the torsion spring of pin 610 experiencing a lack of external force (i.e., no torsion force applied).

Figure 6C:
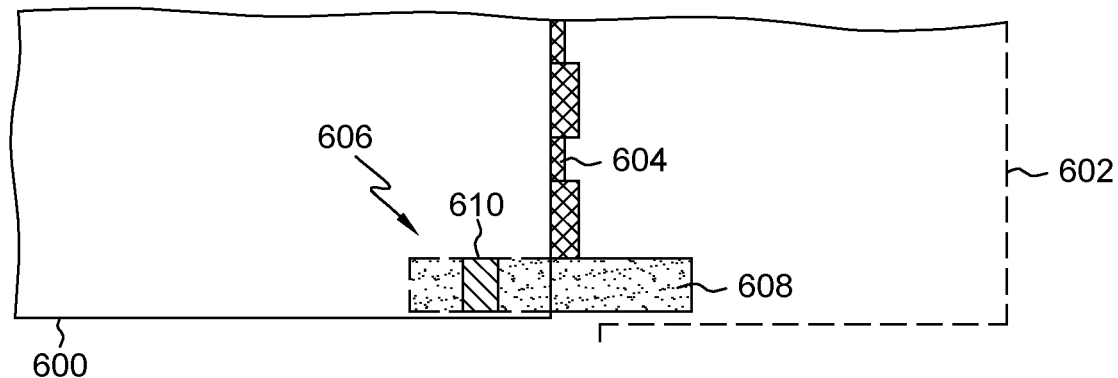
FIG. 6C depicts an enhanced side view of extendable spring loaded arm assembly in an extended state during a full extraction of a metal enclosure from a chassis, in accordance with one embodiment of the present invention.

FIG. 6C depicts an enhanced side view of extendable spring loaded arm assembly in an extended state during a full extraction of a metal enclosure from a chassis, in accordance with one embodiment of the present invention.

In this example, canister 600 is situated outside chassis 602, where electrical connectors 604 are located past a lower wall of chassis 602. An enhanced cutaway side view of extendable spring loaded arm assembly 606 illustrates piston arm 608 in an extended state. As canister 600 is full extracted out of chassis 602, arm 608 of extendable spring loaded arm assembly 606 provides a guide and protective barrier against the lower wall of chassis 602. Arm 608 of extendable spring loaded arm assembly 606 protects electrical connectors 604 by preventing electrical connectors 604 from contacting the lower wall of chassis 602. Additionally, a lower edge of arm 608 of extendable spring loaded arm assembly 606 is situated lower than a lower edge of electrical connectors 604, as previously discussed in FIG. 4.

Figure 7:
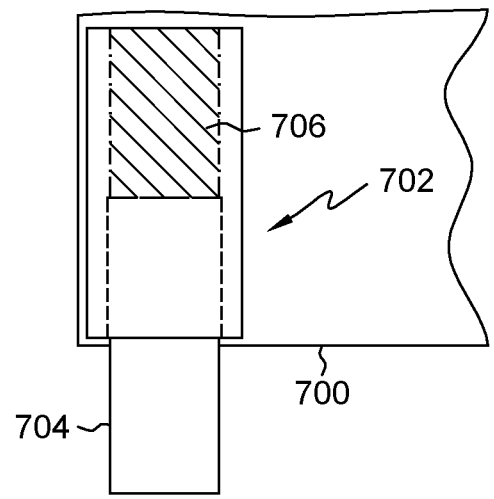
FIG. 7 depicts an enhanced top view of an extendable piston assembly in a partially extended state, in accordance with one embodiment of the present invention.

FIG. 7 depicts an enhanced top view of an extendable piston assembly in a partially extended state, in accordance with one embodiment of the present invention.

In this embodiment, metal enclosure 700 includes a partially contracted extendable piston assembly 702 with piston 704 and compressible member 706. Extendable piston assembly 702 is mounted in a lower corner of metal enclosure 700. Alternatively, extendable piston assembly 702 can be mounted at any point along the lower wall of metal enclosure 700 and as previously discussed, piston 704 can be any shape (e.g., rectangle).

In another embodiment, an additional extendable piston assembly 702 is mounted in another lower corner of metal enclosure 700, where both extendable piston assembly 702 are identical and utilize piston 704 and compressible member 706 with the same or similar specifications. Dual extendable piston assembly 702 located on both lower corners of metal enclosure 700 provide additional support to minimize deflection of a single piston 704 when utilizing only a single extendable piston assembly 702. Additionally, a first piston 704 and a second piston 704 of dual extendable piston assembly 702 can be connected at a lower edge via a cross member orientated parallel to a lower edge of metal enclosure 700. Utilizing the cross member between the dual extendable piston assembly 702 creates a protective U-shaped barrier when the first piston 704 and the second piston 704 are each in an extended state.

Figure 8:
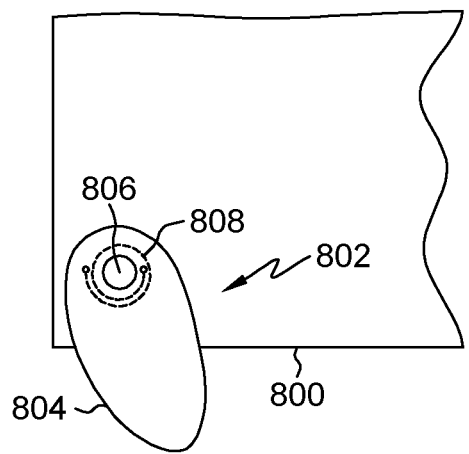
FIG. 8 depicts an enhanced top view of an extendable spring loaded arm assembly in a partially extended state, in accordance with one embodiment of the present invention.

FIG. 8 depicts an enhanced top view of an extendable spring loaded arm assembly in a partially extended state, in accordance with one embodiment of the present invention.

In this embodiment, metal enclosure 800 includes a partially contracted extendable spring loaded arm assembly 802 with arm 804, pin 806, and torsion spring 808. Extendable spring loaded arm assembly 802 is mounted in a lower corner of metal enclosure 800. Alternatively, extendable spring loaded arm assembly 802 can be mounted at any point along the lower wall of metal enclosure 800 and as previously discussed, arm 804 can be any shape. A first end of torsion spring 808 is coupled to arm 804 and a second end of torsion spring 808 is coupled to the lower wall of metal enclosure 800. As arm 804 rotates counterclockwise around pin 806, arm 806 contracts into metal enclosure 800 and a torsional force is applied to torsion spring 808 creating tension in torsion spring 808. As arm 804 rotates clockwise around pin 806, arm 806 extends out of metal enclosure 800 and a torsional force on torsion spring 808 decreases releasing the tension in torsion spring 808. Alternatively, arm 804 can rotate clockwise around pin 806 to contract into metal enclosure 800 and arm 804 can rotate counterclockwise around pin 806 to extend out of metal enclosure 800. As previously discussed in FIG. 6B, extendable spring loaded arm assembly 802 can utilize a stop to prevent arm 804 from extending beyond a certain point. However, in this embodiment extendable spring loaded arm assembly 802 utilizes a sidewall of metal enclosure 800 as a stop for preventing arm 804 from rotating any further.

In other embodiments, extendable piston assembly 702 and/or extendable spring loaded arm assembly 802 are mounted on a single plane surface, where a circuit board assembly with protruding electrical connectors are mounted on the single plane surface. The single plane surface acts as a base without the surround walls that encase the circuit board assembly with protruding electrical connectors. In yet another embodiment, extendable piston assembly 702 and/or extendable spring loaded arm assembly 802 are mounted on a circuit board assembly, without an additional structure to support the circuit board assembly and extendable piston assembly 702 and/or extendable spring loaded arm assembly 802 (e.g., enclosure or single plane surface).

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of an extendable structure for protecting electrical connectors protruding from a metal enclosure of a hardware canister (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus comprising:
an enclosure that includes one or more components, wherein a portion of the one or more components protrudes out of a first side of the enclosure, wherein the one or more components are electrical connectors that join to a first wall of an equipment chassis;
a first extendable member assembly coupled to a lower interior surface of the enclosure, wherein the first extendable member assembly includes:
a first structure coupled to a first compressible member, wherein a force applied to the first structure at the first side of the enclosure translates to the first compressible member;
a pin coupled to the first structure, wherein the first structure rotates around a central axis of the pin; and
a lower edge of the first structure located below a lower edge of the one or more components, wherein a length of the first structure in an extended state is longer than a length of the protruding portion of the one or more components.

2. The apparatus of claim 1, wherein a deflection height of the first structure is less than a height difference between the lower edge of the first structure and the lower edge of the one or more components.

3. The apparatus of claim 1, wherein the first extendable member assembly is coupled to a second side of the enclosure.

4. The apparatus of claim 3, wherein the extended state is a second side of the enclosure preventing the first structure from rotating around the central axis of the pin.

5. The apparatus of claim 4, wherein the first compressible member is a torsional spring.

6. The apparatus of claim 5, wherein a first end of the torsional spring is coupled to the first structure and a second end of the torsional spring is coupled to the lower interior surface of the enclosure.

7. The apparatus of claim 5, wherein a first end of the torsional spring is coupled to the first structure and a second send of the torsional spring is coupled to pin.

8. The apparatus of claim 1, further comprising:
a second extendable member assembly coupled to the lower interior surface of the enclosure, wherein the second extendable member assembly includes:
a second structure coupled to a second compressible member, wherein the force applied to the second structure at the first side of the enclosure translates to the second compressible member; and
a lower edge of the second structure located below the lower edge of the one or more components, wherein a length of the second structure in an extended state is longer than the length of the protruding portion of the one or more components.

9. The apparatus of claim 8, wherein the lower edge of the first structure is coupled to the lower edge of the second structure.

10. The apparatus of claim 9, wherein a deflection height of the second structure is equal to the deflection height of the first structure.

11. The apparatus of claim 10, wherein a central axis of the second structure aligns with a central axis of the second compressible member.

\* \* \* \* \*